(12) United States Patent
Shomrony et al.

(10) Patent No.: US 8,302,065 B2
(45) Date of Patent: Oct. 30, 2012

(54) DEVICE AND METHOD FOR TESTING A DEVICE

(75) Inventors: Oshri Shomrony, Herzelia (IL); Aner Kantor, Kibutz Eilot (IL); Lior Moheban, Ramat-Gan (IL); Ytzhak Rosenthal, Neve Monoson (IL)

(73) Assignee: Freescale Semiconductor, Inc., Austin, TX (US)

( * ) Notice: Subject to any disclaimer, the term of this patent is extended or adjusted under 35 U.S.C. 154(b) by 613 days.

(21) Appl. No.: 12/281,927

(22) PCT Filed: Mar. 13, 2006

(86) PCT No.: PCT/IB2006/050780
§ 371 (c)(1),
(2), (4) Date: Sep. 5, 2008

(87) PCT Pub. No.: WO2007/105036
PCT Pub. Date: Sep. 20, 2007

(65) Prior Publication Data
US 2009/0206866 A1      Aug. 20, 2009

(51) Int. Cl.
*G06F 17/50* (2006.01)
(52) U.S. Cl. ............................... 716/136; 716/119
(58) Field of Classification Search .................. 716/119, 716/136
See application file for complete search history.

(56) References Cited

U.S. PATENT DOCUMENTS

| | | | |
|---|---|---|---|
| 5,960,008 A | 9/1999 | Osawa et al. | |
| 6,701,476 B2 | 3/2004 | Pouya et al. | |
| 7,134,061 B2 * | 11/2006 | Agashe et al. | 714/726 |
| 7,137,086 B2 * | 11/2006 | Abramovici | 716/106 |
| 2003/0120986 A1 | 6/2003 | Whetsel | |
| 2004/0187058 A1 | 9/2004 | Yamada et al. | |
| 2005/0091561 A1 | 4/2005 | Lee | |
| 2005/0091622 A1 | 4/2005 | Pappu | |
| 2005/0204236 A1 | 9/2005 | Whetsel | |
| 2005/0283690 A1 | 12/2005 | McLaurin | |

FOREIGN PATENT DOCUMENTS

WO      2005088325 A1      9/2005

OTHER PUBLICATIONS

Qiang Xu et al., "Wrapper design for testing ip cores with multiple clock domains", Design, Automation and Test in Europe Conference and Exhibition, 2004, Proceedings Feb. 16-20, 2004, Piscataway, NJ, USA, IEEE, vol. 1, Feb. 16, 2004, pp. 416-421, XP010684606, ISBN 0-7695-2085-5.
S. Koranne et al, "Design of Reconfigurable Access Wrappers for Embedded Core Based SOC Test", Proceedings of the International Symposium on Quality Electronic Design (ISQED' 02), 2002 IEEE.
A. Sehgal et al., "IEEE P1500-Compliant Test Wrapper Design for Hierarchical Cores", ITC International Test Conference, Paper 42.2, pp. 1203-1212, Oct. 26-28, 2004.

* cited by examiner

*Primary Examiner* — Jack Chiang
*Assistant Examiner* — Brandon Bowers

(57) ABSTRACT

A device that includes a core and a wrapper. The wrapper includes at least one shared wrapper cell that is shared by a group of core pins that belong to a single clock domain. A method for designing a wrapper. The method includes receiving design information representative of a design of a core, locating a group of mutually independent core pins that belong to a single clock domain; and designing a shared wrapped cell that is shared by the group of core pins.

20 Claims, 8 Drawing Sheets

DEVICE AND METHOD FOR TESTING A DEVICE

FIELD OF THE INVENTION

The present invention relates to methods for testing devices, methods for designing wrappers and a device having test capabilities.

BACKGROUND OF THE INVENTION

The complexity of integrated circuits forced designers to use various testing procedures and architectures.

During the last couple of years a group of companies developed what is now known as the IEEE P1500 scalable architecture for testing embedded cores. In a nutshell, the P1500 defines an integrated circuit architecture that is based upon wrappers that wrap cores (these re-usable cores are also referred to as Intellectual Property). The development of the P1500 was intended to ease the testing procedures of multiple core integrated circuits and simplify the re-use of previously developed cores.

Various patents and patent applications, all being incorporated herein by reference, describe devices and method for testing components using wrappers. Some of the mentioned patents and patent applications describe P1500 compliant architectures: U.S. patent application publication serial number 2005/0204236A1 of Whetsel, U.S. patent application publication serial number 2004/0187058A1 of Yamada et al., U.S. patent application publication serial number 2005/0283690 of McLaurin; U.S. Pat. No. 6,701,476 of Pouya et al., U.S. patent application publication serial number 2003/0120986A1 of Whestel; and PCT patent application publication serial number WO2005/088325 of Goel.

The following two articles, also being incorporated herein by reference, also describe P1500 compliant wrappers: "Design of reconfigurable access wrappers for embedded core based SOC test", S. Kpranne, Proceedings of the international symposium on quality electronic design (ISQED' 02), 2002 IEEE; and "IEEE P1500-compliant test wrapper design for hierarchical cores", A. Sehgal, S. K. Goel, E. J. Marinissen, K. Chakrabarty, ICT international test conference, 2004 IEEE.

FIG. 1 illustrates a prior art P1500 compliant integrated circuit 8. For simplicity of explanation FIG. 1 illustrates only a single core 9, but those of skill in the art will appreciate that a P1500 compliant integrated circuit usually includes multiple cores that can be arranged in a hierarchical manner.

Integrated circuit 8 includes core 9 that is wrapped by wrapper 11. Core 9 has many core pins. Each core pin is connected to one wrapper cell. It is noted that two wrapper cells can be required per core pin if the wrapper is required to enable at speed testing of core 9.

The wrapper cells 12 are also connected to each other in order to form a wrapper boundary register. In addition, wrapper 11 includes a wrapper serial input 12, a wrapper serial output (WSO) 13, a wrapper instruction register (WIR) 17, a wrapper bypass register 15, and test access mechanism (TAM) 16 that is connected to wrapper 11.

Many modern cores include a large number of pins. Allocating one or even two wrapper cells per each core pin is area consuming, as well as complicates the design of the wrapper.

There is a need to provide an efficient wrapper, efficient method for designing wrappers and an efficient method for testing devices.

SUMMARY OF THE PRESENT INVENTION

Method for testing a device, method for designing a wrapper and a device having test capabilities as described in the accompanying claims.

BRIEF DESCRIPTION OF THE DRAWINGS

The present invention will be understood and appreciated more fully from the following detailed description of embodiments thereof taken in conjunction with the accompanying drawings in which.

DETAILED DESCRIPTION OF PREFERRED EMBODIMENTS

Embodiments of the present invention illustrated in the accompanying drawings provide a device that includes a core and a wrapper that includes at least one shared wrapper cell that is shared by a group of core pins that belong to a single clock domain. Typically, an integrated circuit that includes multiple clock domains may include one or more shared wrapper cells per clock domain.

Embodiments of the present invention illustrated in the accompanying drawings provide a method for testing a device. The method includes determining whether to operate an integrated circuit in a test mode or in a non-test mode, and connecting a group of core pins (that belong to a single clock domain) to a shared wrapper cell during a test mode.

Embodiments of the present invention illustrated in the accompanying drawings provide a method for designing a wrapper. The method includes receiving information representative of a design of a core; locating a group of mutually independent core pins that belong to a single clock domain; and designing a shared wrapped cell that is shared by the group of core pins.

The integrated circuit 10 is conveniently a part of a device 10' such as but not limited to a mobile phone, a music player, a laptop computer, a desktop processor, a base station, and the like. Device 10' can include multiple integrated circuits such as integrated circuit 10. Device 10' can also be an integrated circuit.

Figure 1:
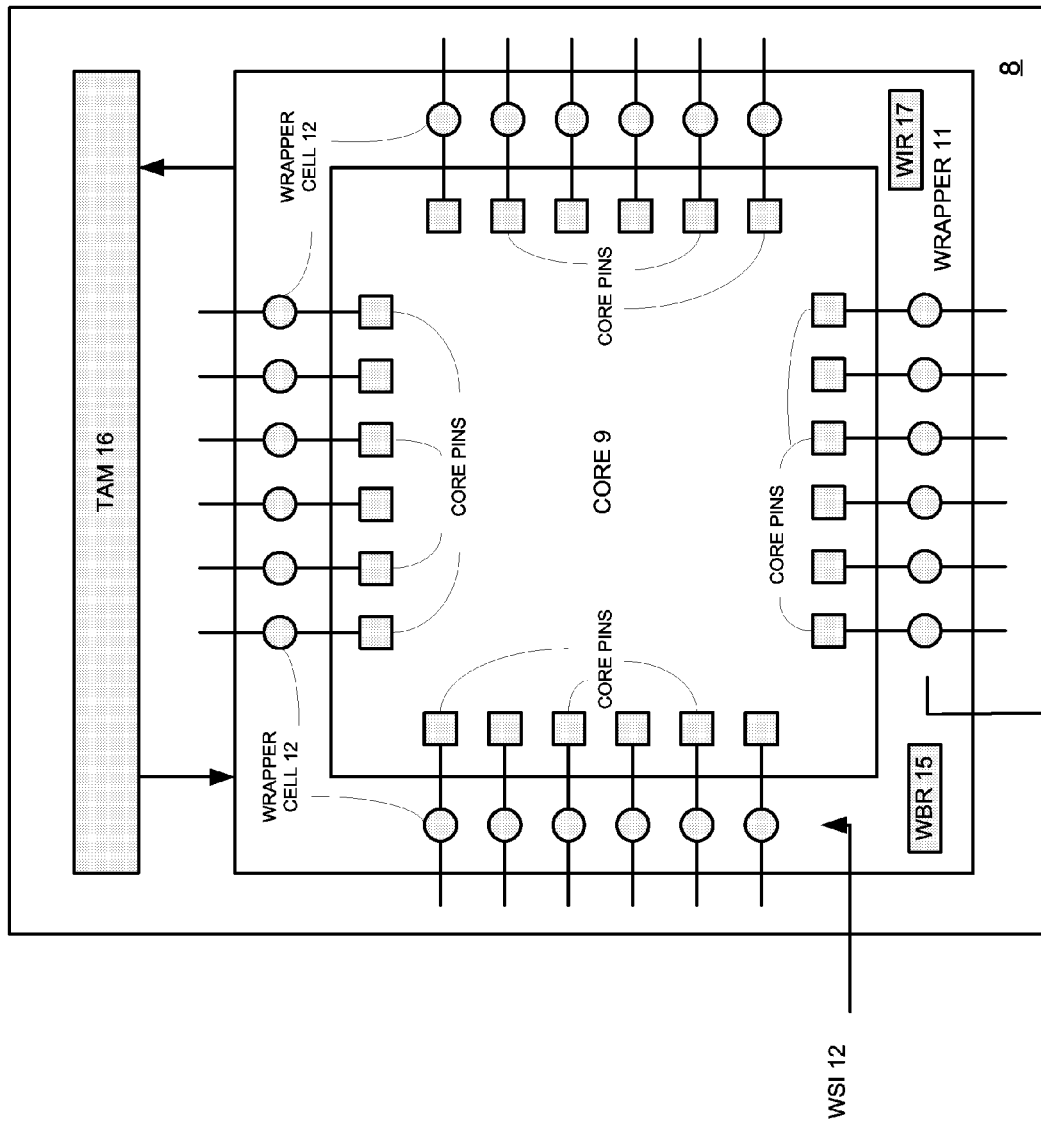
FIG. 1 is a schematic diagram of a prior art P1500 compliant integrated circuit.
Figure 2:
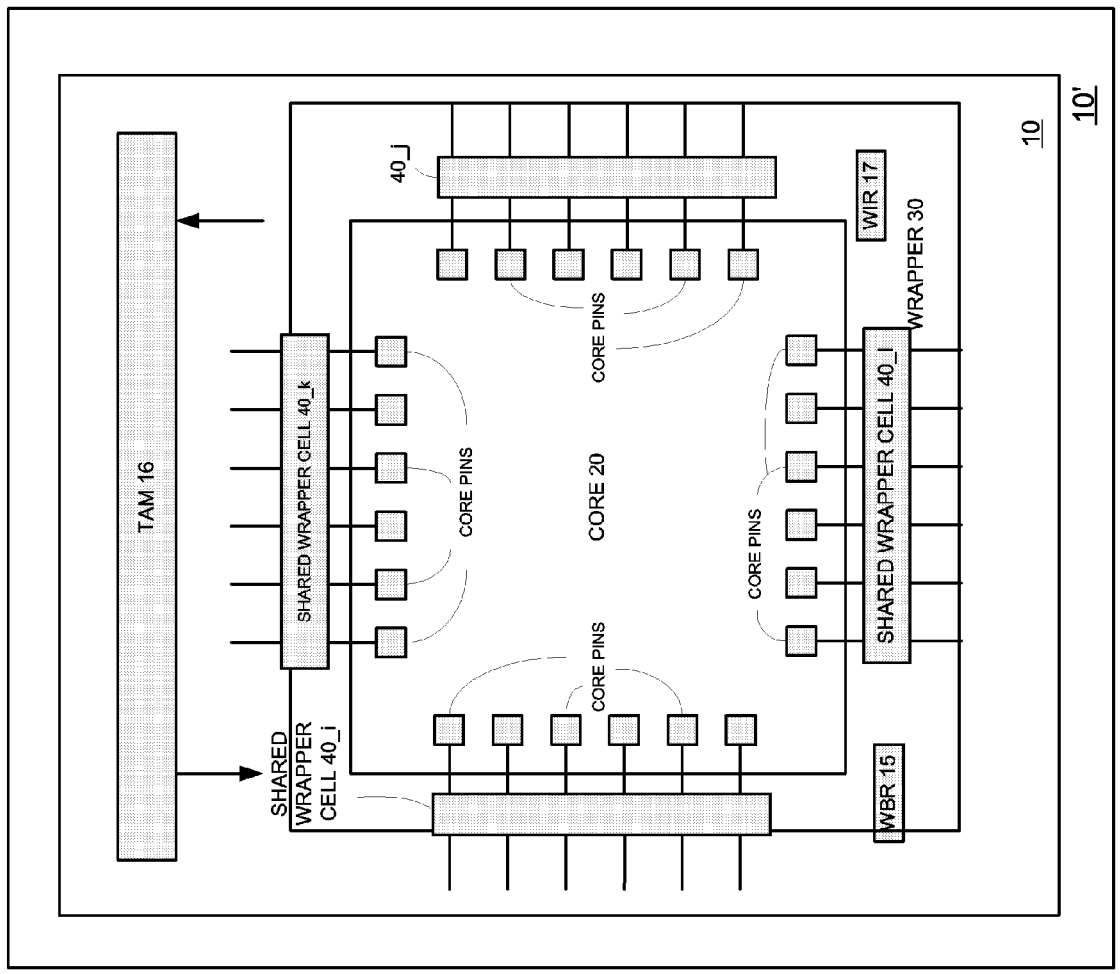
FIG. 2 illustrates a device according to an embodiment of the invention.

FIG. 2 illustrates an integrated circuit 10 according to an embodiment of the invention.

For simplicity of explanation integrated circuit 10 is illustrated as including a single core 20 and as including a single clock domain. It is noted that this is not necessarily so and in many cases a single integrated circuit includes multiple cores. Each core can have its own wrapper. In addition many integrated circuits may include multiple clock domains. Conveniently each clock domain includes one or more shared wrapper cells.

Core 20 includes many pins. A pin includes any type of connector or connection that allows signals to enter the core 20 and/or to be outputted from the core 20.

Core 20 is surrounded by wrapper 30. Wrapper 30 includes multiple wrapper cells, various registers and the like. A wrapper such as 30 can include a large number and even a very large number of shared wrapper cells. The inventors tested a circuit that includes more than two hundred shared wrapper cells.

Wrapper 30 includes one or more shared wrapper cells such as shared wrapper cells 40_*i*, 40_*j*, 40_*k*, and 40_*l*. It is noted that wrapper 30 can include a single wrapper cell, and can include multiple wrapper cells.

A shared wrapper cell is a wrapper cell that can be connected in parallel to a group of core pins, during a certain test mode of the integrated circuit. In other modes, such as a normal (non-test) mode, the shared wrapped cell can be transparent—it receives multiple signals and outputs these multiple signals to the core pins.

By using shared wrapper cells the number of wrapper cells as well as the area of the wrapper can be decreased and even dramatically decreased. The inventors achieved a 1:3 area ratio between a wrapper that was based upon shared wrapper cells and a wrapper that included non-shared test wrapper cells.

Sharing a single wrapper cell by a group of core pins can theoretically limit the testability of the core, as the same test signal is applied to this group of core pins. The inventors found that by selecting group of pins that include mutually independent pins this theoretical limitation does not influence (or does not substantially influence) the testability of the core. In addition, the size of the group of core pins can be adjusted to further reduce any possible testing limitation. Mutually independent pins can be pins that can convey signals that are not dependent upon each other. Mutually independent core pins are pins that are not forced by certain logical connections, to convey signals that differ from each other. Typical dependent core pins are core pins that convey instructions while typical independent core pins convey data. as the constrains imposed upon the values of data that is conveyed over data buses during test modes can be more relaxed.

The inventors compared between a first wrapper that includes non-shared wrapper cells and a second wrapper that included shared wrappers cells. The size of the shared wrapper cells was eight meaning that each wrapper cell is connected to eight core pins. The core included 21,000 flip-flops and was completely scannable (all the flip-flops of the core were connected to form one or more core scan chains).

TABLE 1 compares between the characteristics of both wrappers:

TABLE 1

| Characteristic | First wrapper (non-shared) | Second wrapper (shared) |
|---|---|---|
| Number of wrapper cells | 1824 | 235 |
| Number of wrapper flip-flops | 3648 | 235 |
| Wrapper scan chain length | 912 | 59 |
| Number of patterns (stuck-at/transition) | 3732/10009 | 3787/10089 |
| Scan coverage (stuck-at/transition) | 98.43%/88.59% | 98.40%/88.58% |
| Wrappers data test volume (per chain) | 12.532 Mbit | 0.818 Mbit |
| Total wrapper cells area | 8.1% | 2.6% |

A size of a wrapper cell indicates the number of core pins that are connected to the wrapper cell. The size of different shared wrapper cells can be the same or can differ from each other. For example, shared wrapper cell 40_*k* can have fewer outputs than shared wrapper cell 40_*j*.

Referring back to FIG. 2, shared wrapper cell 40_*k* is shared by a group 60 of core pins that belong to a single clock domain. It is noted that the number of pins that belongs to group 60 exceeds one. The inventors used groups of eight core pins. It is noted that other sized groups can be used.

Figure 4:
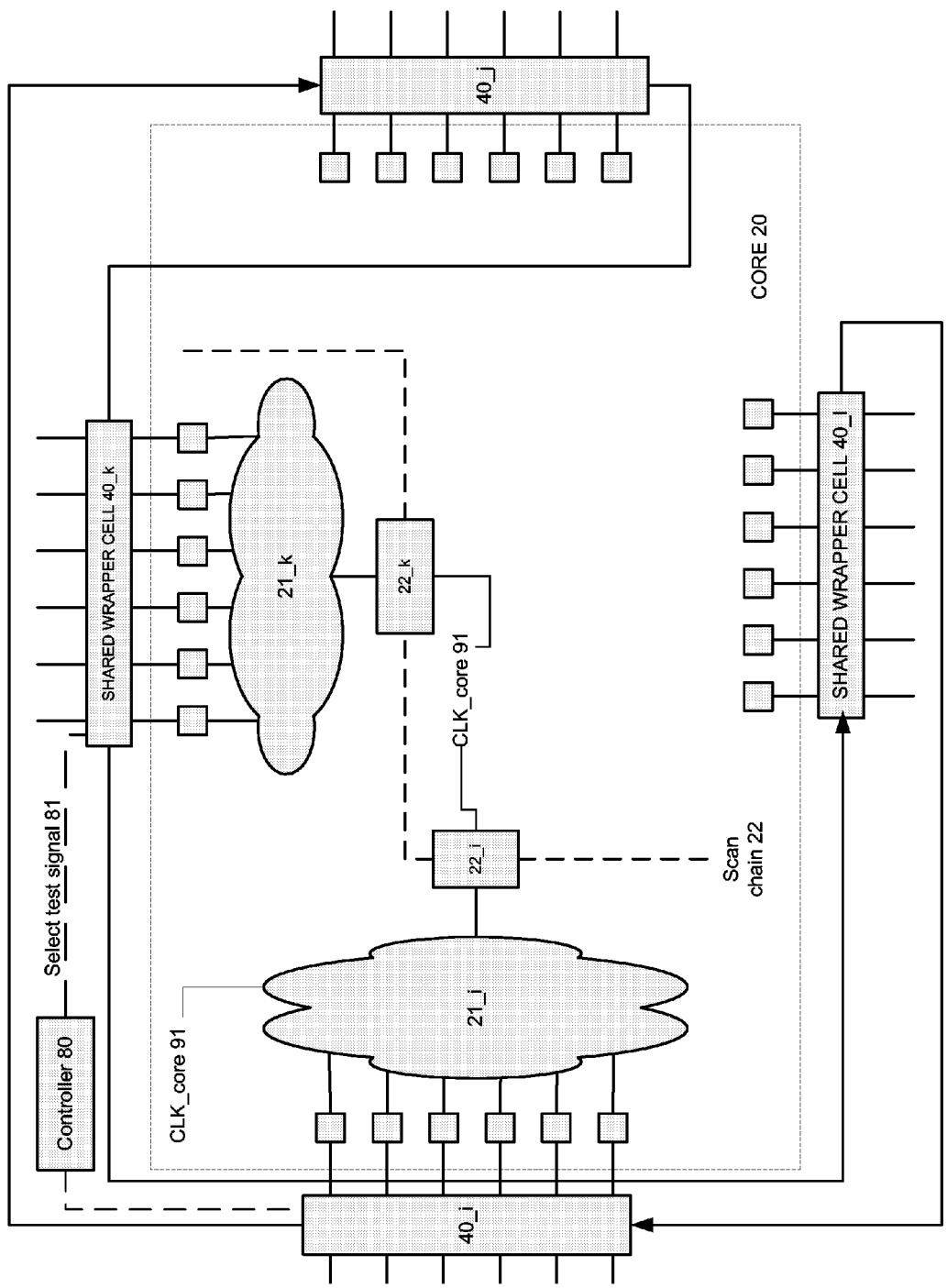
FIG. 4 illustrates multiple shared wrapper cells and additional circuits of a core, according to an embodiment of the invention.

The shared wrapper cell 40_*k* is also connected to other wrapper cells. FIG. 4 illustrates a chain of four shared wrapper cells 40_*i*-40_*l*. It is noted that shared wrapper cells can be connected to non-shared wrapper cells and that the chain of wrapper cells is closed such as to form a loop of wrapper cells, for transition testing.

Figure 3:
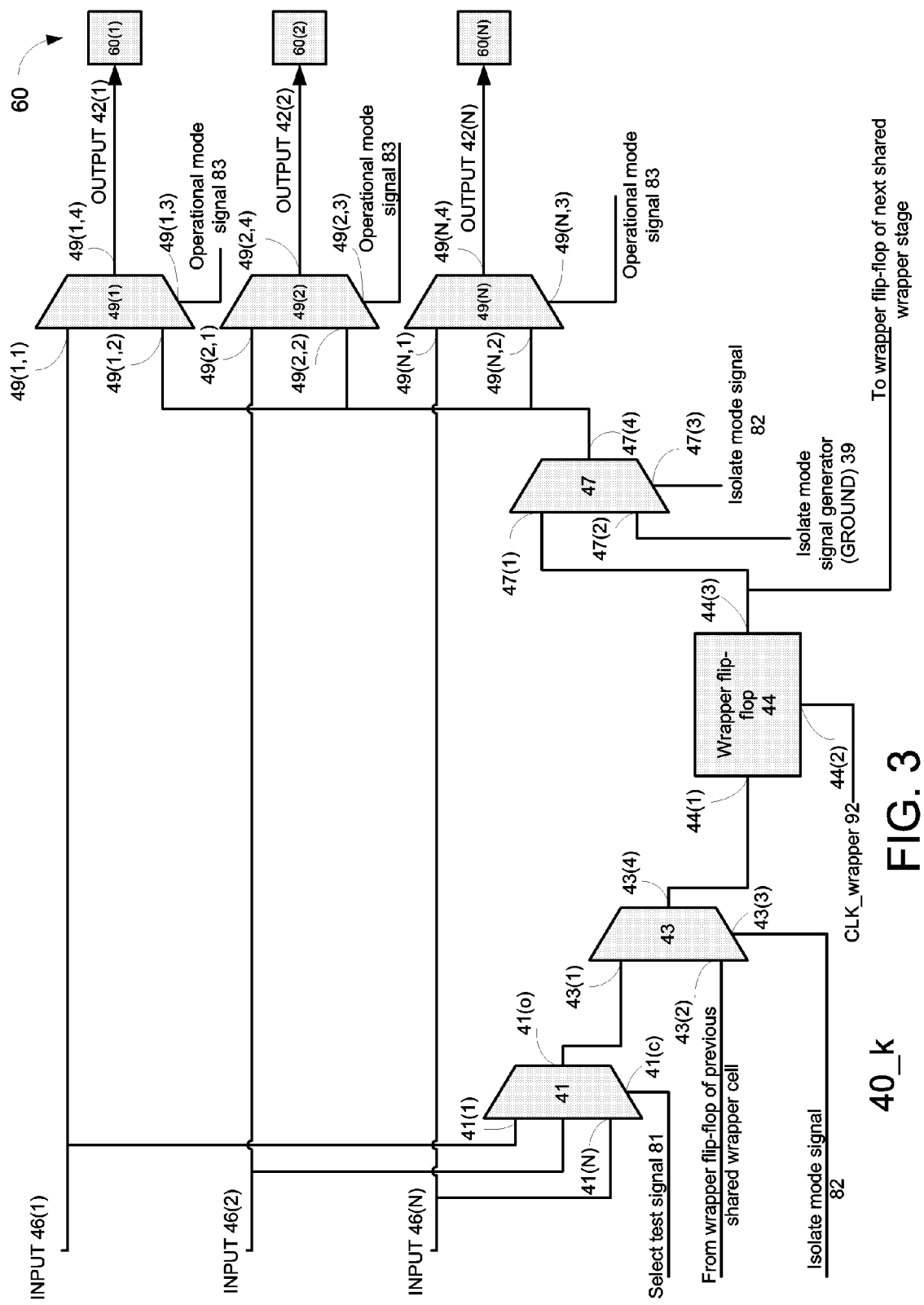
FIG. 3 illustrates a shared wrapper cell according to an embodiment of the invention.

FIG. 3 illustrates a shared wrapper cell 40_*k* according to an embodiment of the invention.

Shared wrapper cell 40_*k* includes: (i) multiple (N) inputs (46(1)-46(N)) collectively denoted 46, wherein N is a positive integer that defines the size of the share wrapper cell 40_*k*, (ii) multiple (N) outputs (42(1)-42(N)) collectively denoted 42, (iii) multiple (N) output multiplexers (49(1)-49(N)), adapted to select between test signal and between an input signal, (iv) wrapper cell flip-flop 44, (v) isolate mode multiplexer 47, (vi) test signal selection multiplexer 41, and (vii) launch multiplexer 43.

Assuming that n is an index that ranges between 1 and N then the 46($n$) input is connected to an n'th input (41($n$)) of the test signal selection multiplexer 41, and to a first input (49($n$, 1)) of output multiplexer 49($n$).

Inputs 41(1)-41(N) of test signal multiplexer 41 are connected to inputs 46(1)-46(N). The control input 41($c$) of test signal multiplexer 41 is connected to control circuit 80 of FIG. 4.

The output 41($o$) of test signal selection multiplexer 41 is connected to a first input 43(1) of launch multiplexer 43. The second input 43(2) of the launch multiplexer 43 is connected to an output of a wrapper flip flop that belongs to a previous shared wrapper cell 40_*j*.

The output 43(4) of launch multiplexer 43 is connected to input 44(1) of wrapper flip-flop 44. Launch multiplexer 43 can send to the wrapper flip-flop 44 either a selected test signal or a signal from a previous wrapper flip-flip. The signal from the previous wrapper flip-flop can be provided to core 20 during a transition test (also referred to as an ac-speed test) of core 20.

Conveniently, a launch vector serially propagates through a chain of wrapper flip-flops. During a transition test the wrapper flip-flops output in parallel the launch vector, and the response of the core (or usually various circuits within the core) is sampled and later on outputted from the core 20.

A first input 47(1) of isolate mode multiplexer 47 is connected to an output 44(3) of wrapper flip-flop 44. A second input 47(2) is connected to an isolate mode signal provider (illustrated as Ground 39). The output 47(4) of isolate mode multiplexer 47 is connected to second inputs 49(1,2)-49(N,2) of output multiplexers 49(1)-49(N).

Each output multiplexer 49(n) includes two inputs 49(n,1) and 49(n,2), one control input 49(n,3) and one output 49(n,4). The first input 49(n,1) of output multiplexer 49(n) is connected to the n'th input 46(n), while the output 49(n,4) of output multiplexer 49(n) is connected to an n'th core pin of group 60. Outputs (46(1)-46(N)) are collected to multiple input pins (60(1)-60(N)) that belong to a group 60 of core pins.

Second inputs 49(1,2)-49(N,2) of output multiplexers 49(1)-49(N) are connected to the output 47(4) of isolate mode multiplexer 47.

The n'th output 42(n) of shared wrapper cell 40 can provide to core pin 60 (n): (i) an input signal from a corresponding input (46(n)) of shared wrapper cell 40_k, during a non-test mode of integrated circuit 10; (ii) an isolate signal from isolate mode multiplexer 47, during an isolate mode; or (iii) a test signal, provided from wrapper cell flip-flop 44. It is noted that the test signal as well as the isolate signal are provided in parallel to all outputs 42(1)-42(N).

Multiplexers 41, 43, 47 and 49(1)-49(N) are controlled by control signals that are generated by a controller 80 (illustrated in FIG. 4). At least part of the controller 80 can be included within wrapper 30.

Controller 80 sends the following control signals: (i) select test signal 81, (ii) isolate mode signal 82, and (iii) operational mode signal 83. Select test signal 81 is provided to test signal selection multiplexer 41 in order to select which input out of inputs 46(1)-46(N) shall provide a selected test signal to wrapper flip-flop 44. Isolate test mode 82 is provided to isolate mode multiplexer 47 in order to select whether to provide an isolate mode signal to output multiplexers 49(1)-49(N) or to provide a test signal to these output multiplexers. Optionally, the isolate mode is also provided to launch multiplexer 43 so that it selects the output of the previous wrapper flip-flop during at speed test. Operational mode signal 83 is provided to each of the output multiplexers.

Those of skill in the art will appreciate that the wrapper flip-flop can be a part of a scan chain. Such a scan chain can include flip-flops of wrapper cells but this is not necessarily so. For simplicity of explanation the additional logic (usually an additional multiplexer) required for connecting the wrapper flip-flop to another flip-flop that belongs to the scan chain (if that other flip-flop differs from the wrapper flip-flops of wrapper cells 40_j and 40_l) is not illustrated.

Figure 8:
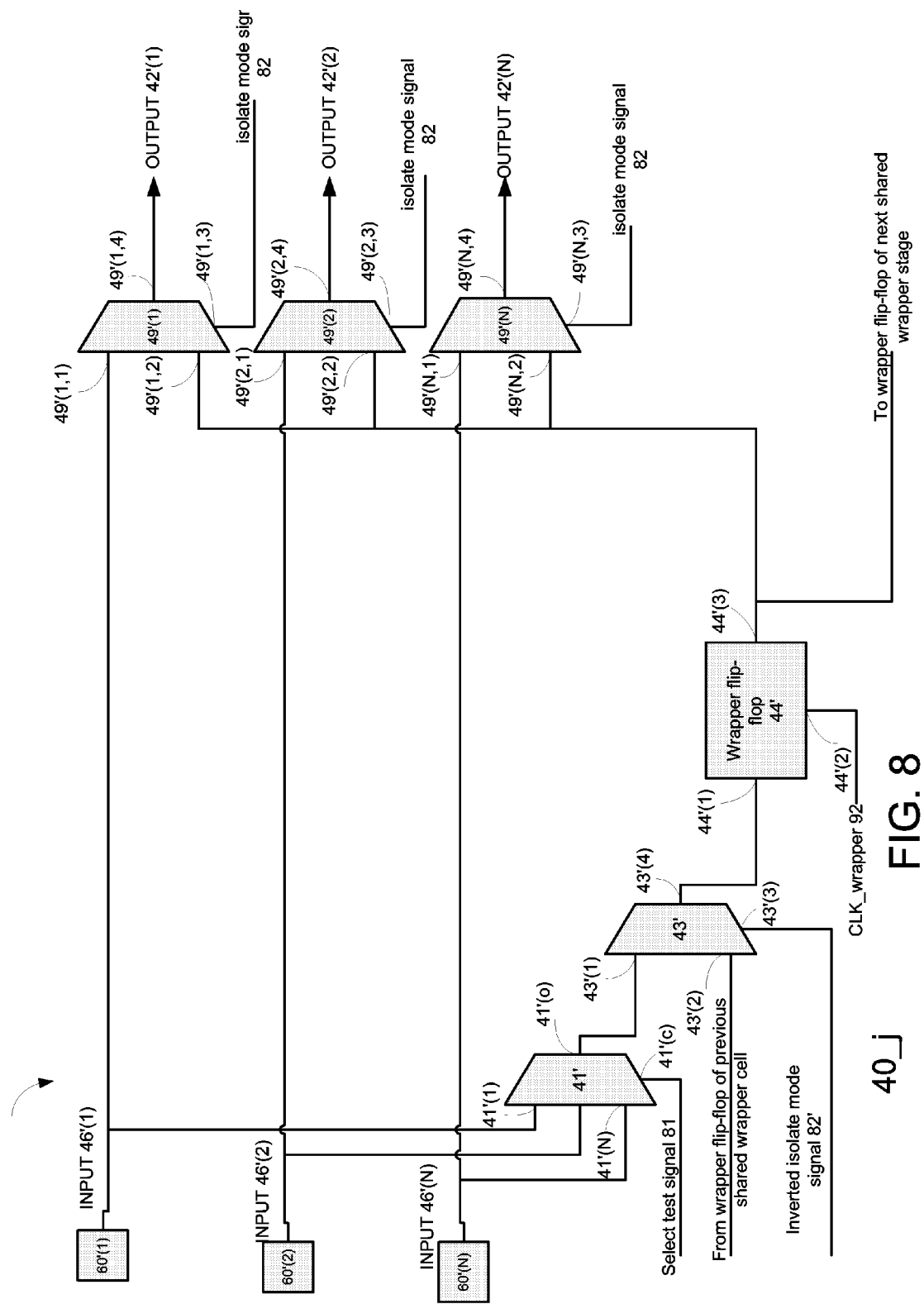
FIG. 8 illustrates a shared wrapper cell according to an embodiment of the invention.

FIG. 8 illustrates a shared wrapper cell 40_j according to an embodiment of the invention.

Shared wrapper cell 40_j is conveniently used as an output shared wrapper cell that is connected to outputs of a core while shared wrapper cell 40_k is conveniently used as an input shared wrapper cell that is connected to inputs of a core.

Shared wrapper cell 40_j differs from shared wrapper cell 40_k by not having an isolate mode multiplexer 47, by controlling its output multiplexers by isolate mode signal 82 instead of controlling its output multiplexers by a operational mode signal 83, and by providing an inverted isolate mode signal (instead of providing an isolate mode signal) to its launch multiplexer.

Shared wrapper cell 40_j includes: (i) multiple (N) inputs (46'(1)-46'(N)) collectively denoted 46', wherein N is a positive integer that defines the size of the share wrapper cell 40_j, (ii) multiple (N) outputs (42'(1)-42'(N)) collectively denoted 42', (iii) multiple (N) output multiplexers (49'(1)-49'(N)), adapted to select between test signal and between an input signal, (iv) wrapper cell flip-flop 44', (v) test signal selection multiplexer 41', and (vi) launch multiplexer 43'.

Due to the absence of isolate mode multiplexer 47 the output 44'(3) of wrapper flip-flop 44 is connected to the second inputs 49'(1,2)-49' (N,2) of output multiplexers 49'.

The multiple (N) inputs (46'(1)-46' (N)) are collected to multiple output pins (60' (1)-60' (N)) of core 60, collectively denoted 60'.

FIG. 4 illustrates multiple shared wrapper cells 40_i-40_l and additional circuits of core 20, according to an embodiment of the invention.

Shared wrapper cells 40_i and 40_k are connected to input pins of core 20 while shared wrapper cells 40_j and 40_l are connected to output pins of core 20. These four shared wrapper cells are connected in serial to each other such as to form a closed loop. All shared wrapper cells receive the same select test signal 81 from controller 80.

Shared wrapper cells 40_i and 40_k, as well as additional wrapper cells (not shown) are used to serially propagate a launch vector. The launch vector can be provided to these wrapper cells via a wrapper serial input (WPI).

Shared wrapper cells 40_i and 40_k are connected to circuits 21(i) and 21(j) of core. Circuits 21(i) and 21(j) are also connected to sampling circuit 22(i) and 22(j). Sampling circuits 22(i) and 22(j) can be a part of scan chain 22.

During an at-speed test the shared wrapper cell 40_i sends to circuits 21(i) and 21(j) a launch vector. The response of circuits 21(i) and 21(j) to the launch vector is sampled by sampling circuit 22(i) and 22(j). This response vector can be later outputted from core 20 in various manners, for example by using a scan chain 22 that includes sampling circuits 22(i) and 22(j).

Typically, core 20 receives a very fast clock signal (CLK_core 91), while the shared wrapper cells 40 receives a much slower clock (CLK_wrapper 92). The transition test is enabled by synchronizing both clocks, so that during a launch cycle both clock signal transient substantially simultaneously. This is not necessarily so. For example, the frequency of the clock provided to the shared wrapper cells can equal the frequency of the clock provided to core 20, as illustrated by the dashed waveform denoted CLK_wrapper 92'.

Figure 5:
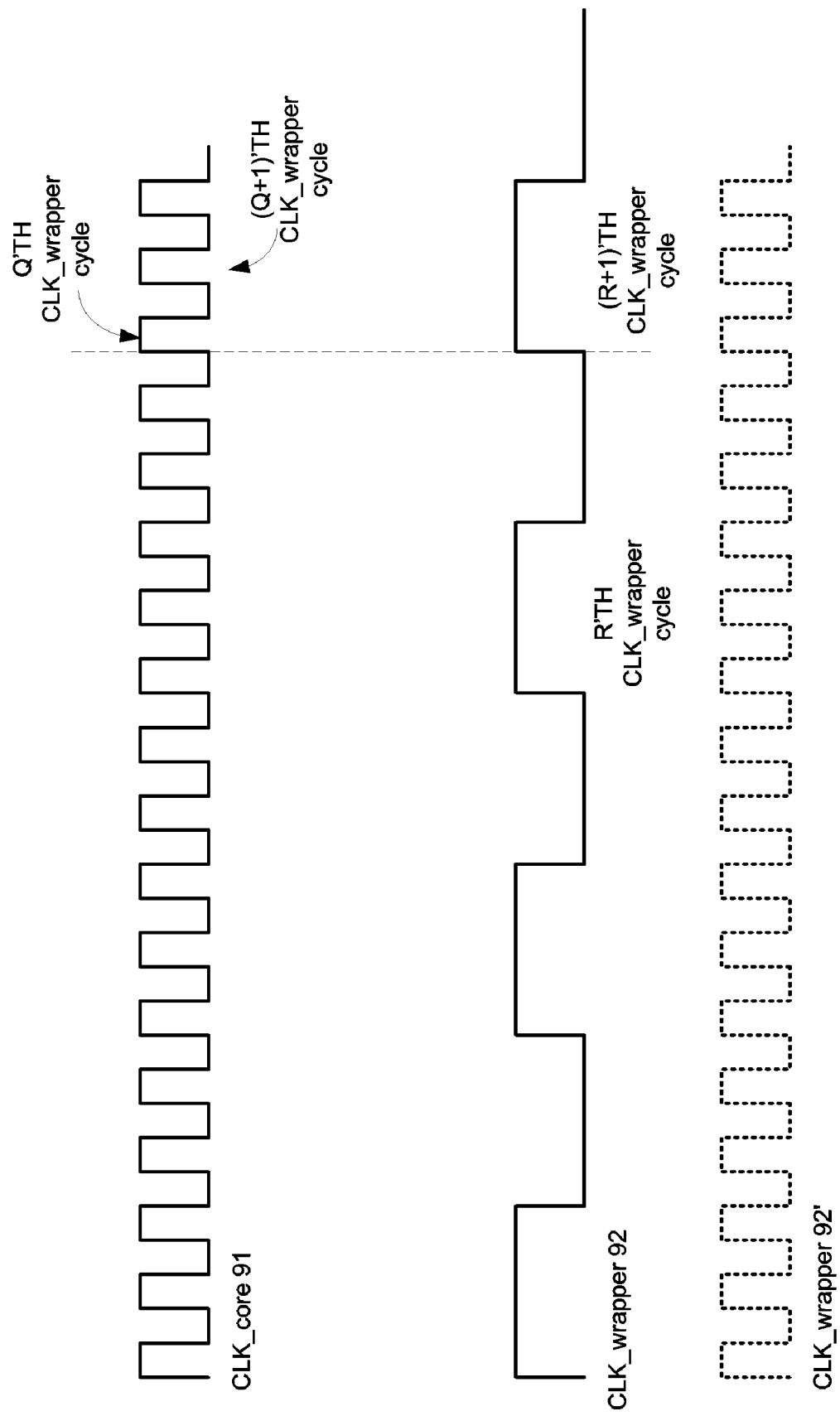
FIG. 5 is a timing diagram illustrating various clock signals that are provided to shared wrapper cells, according to an embodiment of the invention.

FIG. 5 is a timing diagram illustrating various clock signals that are provided to shared wrapper cells 40_i and 40_k, according to an embodiment of the invention.

If the input shared wrapper cells include R shared wrapper cells then during R cycles of CLK_wrapper 92 the launch vector serially propagates through these shared wrappers of the chain. At the (R+1)'th cycle of CLK_wrapper 92 the launch vector is provided to core 20 and especially to various tested circuits such as 21(i) and 21(j).

The (R+1)'th cycle of CLK_wrapper 92 starts when a Q'th cycle of CLK_core 91 starts. At the (Q+1)'th clock cycle of CLK_core 91 the response of core 20 is sampled.

Figure 6:
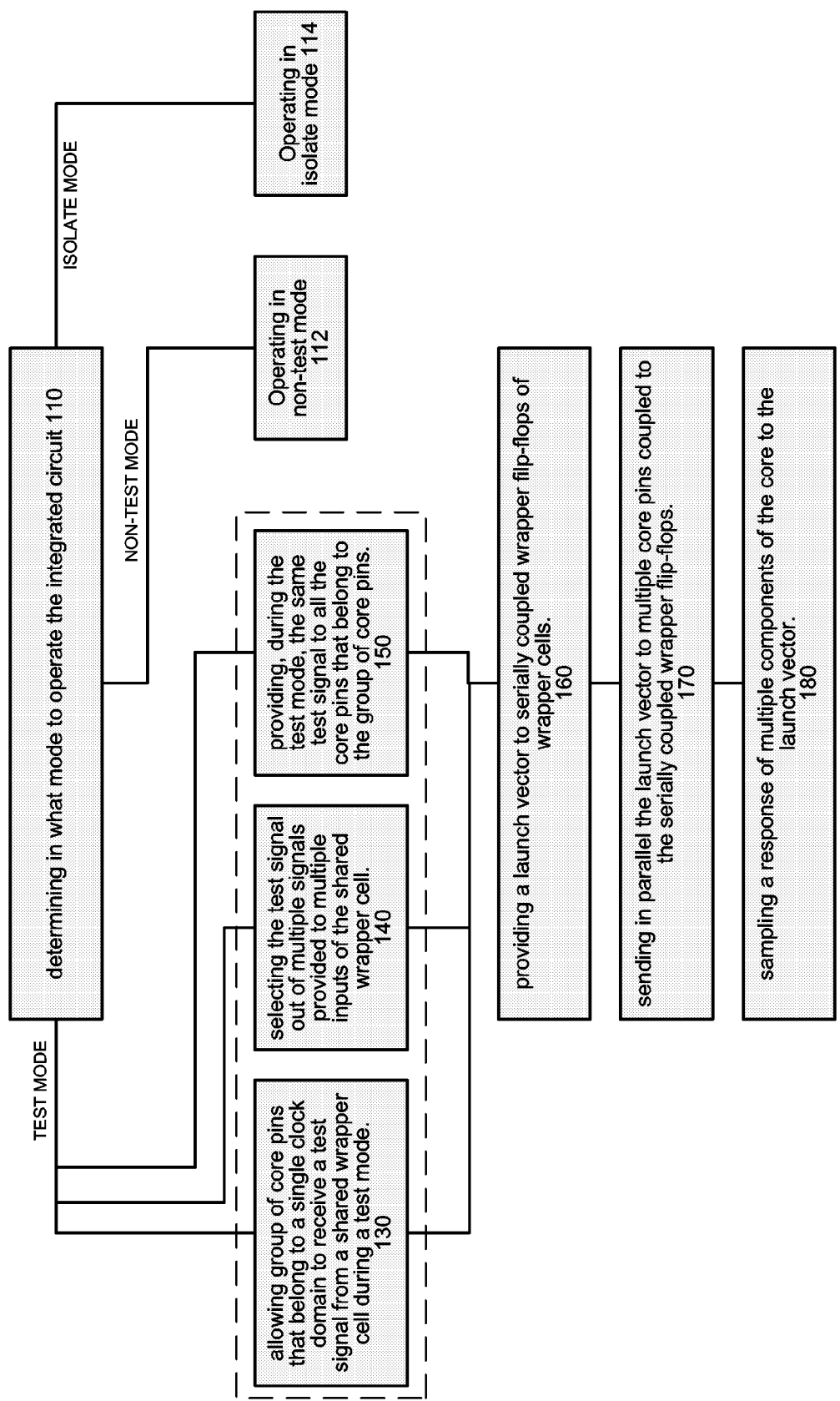
FIG. 6 is a flow chart of a method for testing a device, according to an embodiment of the invention.

FIG. 6 is a flow chart of method 100 for testing a device, according to an embodiment of the invention.

Method 100 starts by stage 110 of determining the operational mode of a core. Conveniently, the core can operate in a non-test mode, in an isolate mode and in a test mode.

If non-test mode is selected stage 110 is followed by stage 112 of operating in a non-test mode during which the wrapper cell is transparent. Referring to the example set in previous figures, the signals that arrive to inputs 46(1)-46(N) are provided, via output multiplexers 49(1)-49(N) to outputs 42(1)-42(N).

If an isolate mode is selected then stage 110 is followed by stage 114 of operating in an isolate mode. During this mode input shared wrapper cells provide isolate mode signals (such as ground) to the core, thus isolating the core from inputs signals provided to the inputs of the shared wrapper cell.

If test mode is selected then stage 110 is followed by stages 140-150. Stage 130 includes allowing group of core pins that belong to a single clock domain to receive a test signal from a shared wrapper cell during a test mode.

Stage 140 includes selecting the test signal out of multiple signals provided to multiple inputs of the shared wrapper cell.

Stage 150 includes providing, during the test mode, the same test signal to all the core pins that belong to the group of core pins. Conveniently, stage 150 includes connecting all the core pins that belong to the group of core pins to a wrapper cell flip-flop within the shared wrapper cell.

Stage 150 can be followed by stage 110 or stage 160.

Stage 160 includes providing a launch vector to serially connected wrapper flip-flops of shared wrapper cells.

Stage 160 is followed by stage 170 of sending in parallel the launch vector to multiple core pins that are connected to the serially connected wrapper flip-flops.

Stage 170 is followed by stage 180 of sampling a response of multiple components of the core to the launch vector.

Figure 7:
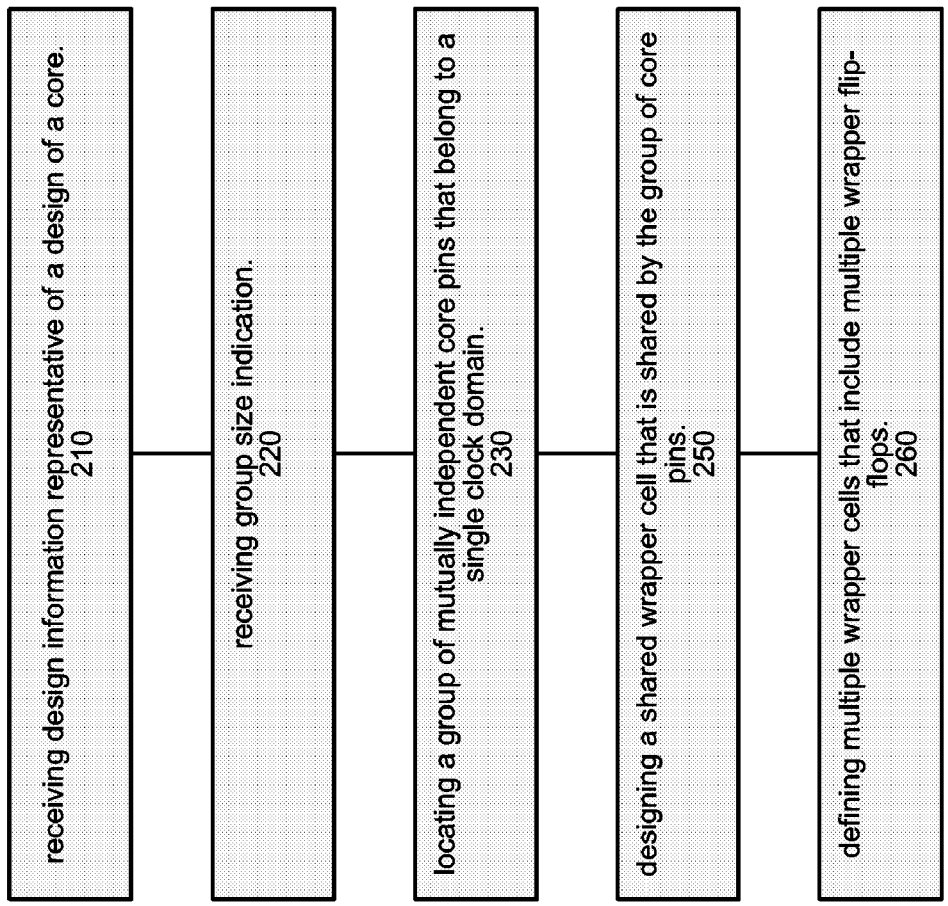
FIG. 7 is a flow chart of a method for designing a wrapper, according to an embodiment of the invention.

FIG. 7 is a flow chart of method 200 for designing a wrapper, according to an embodiment of the invention.

Method 200 starts by stage 210 of receiving design information representative of a design of a core.

Stage 210 is followed by stage 220 of receiving group size indication. This can indicate allowable sizes of groups of core pins that share shared wrapper cells. The previous drawings illustrated an N sized shared wrapper cell 40_k.

Stage 220 is followed by stage 230 of locating a group of mutually independent core pins that belong to a single clock domain. Conveniently, stage 230 is responsive to the group size information. It is noted that a typical integrated circuit includes many groups of mutually independent core pins. These can be data conveying core pins but this is not necessarily so.

According to an embodiment of the invention the user or designer can provide group size information, the method can locate one or more groups in response to the design information, and if the size of the group does not match the group size then another iteration of the locating stage can be executed. Alternatively the user or designed can be requested to alter the size group information.

Stage 230 is followed by stage 250 of designing a shared wrapper cell that is shared by the group of core pins. Conveniently, the designing includes designing the wrapper cell such as to be transparent during a normal mode. Such a shared wrapper cell can have substantially the same structure of shared wrapper cell 40_k.

Stage 250 is followed by stage 260 of defining a sequence of wrapper flip-flops wherein at least one wrapper flip-flop can operate as a launch element for an adjacent wrapper flip-flop. A launch element is an element that propagates a launch vector to another launch element.

Referring to the example provided in FIG. 3, the shared wrapper cells may include shared wrapper cells 40_i and 40_k. These shared wrapper cells include wrapper flip-flops that are serially connected to each other by circuits such as launch multiplexer 43.

In order to enable at speed tests, the wrapper flip-flops should be designed to propagate a launch vector and to provide the launch vector to various circuits within core 20 during a launch cycle.

The clock signal provided to the wrapper flip flops should be synchronized with the clock signal that is provided to the circuits within core 20 that are tested during the at speed test.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. A device that comprises:
    a data processor core; and
    a plurality of wrapper cells for providing test access to the data processor core, the plurality of wrapper cells including a first wrapper cell that is shared by a group of pins of the data processor core that belong to a single clock domain, wherein each of the plurality of wrapper cells consists of only one flip flop and other components that are not flip flops.

2. The device according to claim 1 wherein:
    the first wrapper cell comprises a group of outputs, each output of the group of outputs coupled to a corresponding one pin of the group of pins; and
    during a test mode each pin of the group of pins receives the same test signal.

3. The device according to claim 2 wherein a flip-flop at the first wrapper cell is coupled to the group of outputs during the test mode.

4. The device according to claim 2 wherein the first wrapper cell comprises a group of inputs, and an input selection circuit adapted to select one input of the group of inputs.

5. The device of claim 2 wherein an output of a flip-flop at the first wrapper cell is coupled to an input of a flip-flop at an adjacent wrapper cell.

6. The device according to claim 1 wherein an output of a flip-flop at the first wrapper cell is coupled to an input of a flip-flop at an adjacent wrapper cell.

7. The device according to claim 1 wherein the core pins that belong to the group of pins are logically independent.

8. The device according to claim 1 wherein the core pins that belong to the group of pins convey data signals during a non-test mode of the integrated circuit.

9. The device according to claim 1 wherein the plurality of wrapper cells comprises at least one wrapper cell that is associated with only one core pin.

10. The device according to claim 1 wherein the plurality of wrapper cells comprises a second wrapper cell, wherein the first shared wrapper cell has fewer output pins than the second wrapper cell.

11. A method comprising:
    configuring an operational mode of a data processor core using automated test equipment; and
    providing a test signal to a group of core pins that belong to a single clock domain using a first wrapper cell of a plurality of wrapper cells if the operational mode is a test mode, the plurality of wrapper cells to provide test access to the data processor core, wherein each of the plurality of wrapper cells consists of only one flip flop and other components that are not flip flops.

12. The method according to claim 11 further comprising providing, during the test mode, the same test signal to all of the core pins that belong to the group of core pins.

13. The method according to claim 12 wherein the providing comprises coupling an output of a flip-flop at the first wrapper cell to each core pin of the group of core pins.

14. The method according to claim 12 wherein the providing is preceded by selecting the test signal from a set of test signals, each test signal of the set of test signals received at a corresponding one input of the first wrapper cell.

15. The method according to claim 12 further comprising:
providing a launch vector to the plurality of wrapper cells, the launch vector shifted serially into a respective flip-flop at each of the plurality of wrapper cells, and transferring in parallel respective bits of the launch vector to corresponding core pins coupled to the serially coupled wrapper flip-flops; and
sampling a response of multiple components of the data processor core to the launch vector.

16. The method according to claim 12 further comprising defining a group of core pins that are logically independent.

17. A method for designing a test access wrapper at a data processor core, the method comprising:
receiving at a computer information representative of a design of the data processor core;
identifying at the computer a first group of core pins that are logically independent and that belong to a single clock domain; and
instantiating a first wrapper cell at the design that is shared by the first group of core pins, wherein the first wrapper cell consists of only one flip flop and other components that are not flip flops.

18. The method according to claim 17 further comprising receiving a group size, and wherein the identifying is responsive to the group size information.

19. The method according to claim 17 wherein the first wrapper cell transparently communicates information from a first input to a corresponding one output if the data processor core is configured to operate in a normal mode.

20. The method of claim 17 further comprising:
identifying at the computer a second group of core pins that are logically independent and that belong to a single clock domain; and
instantiating a second wrapper cell at the design that is shared by the second group of core pins, the second wrapper cell including a single flip-flop, wherein an output of the flip-flop at the first wrapper cell is connected to an input at the flip-flop at the second wrapper cell.

* * * * *